US012773068B2

(12) United States Patent
Golway

(10) Patent No.: US 12,773,068 B2
(45) Date of Patent: Oct. 27, 2026

(54) SYSTEMS AND METHODS FOR USING A THERMOELECTRIC MODULE (TEM) DEVICE FOR UNIFORM HEATING

(71) Applicant: Advanced Solutions Holdings, LLC, Louisville, KY (US)

(72) Inventor: Michael W. Golway, Louisville, KY (US)

(73) Assignee: ADVANCED SOLUTIONS HOLDINGS, LLC, Louisville, KY (US)

( * ) Notice: Subject to any disclaimer, the term of this patent is extended or adjusted under 35 U.S.C. 154(b) by 1097 days.

(21) Appl. No.: 16/940,735

(22) Filed: Jul. 28, 2020

(65) Prior Publication Data

US 2021/0030204 A1 Feb. 4, 2021

Related U.S. Application Data

(60) Provisional application No. 62/879,712, filed on Jul. 29, 2019.

(51) Int. Cl.
*A47J 37/07* (2006.01)
*A47J 36/32* (2006.01)
(Continued)

(52) U.S. Cl.
CPC ....... *A47J 37/0786* (2013.01); *A47J 37/0704* (2013.01); *F27D 5/00* (2013.01);
(Continued)

(58) Field of Classification Search
CPC ...... A47J 36/321; A47J 37/041; A47J 37/048; A47J 37/0704; A47J 37/0786;
(Continued)

(56) References Cited

U.S. PATENT DOCUMENTS 2,253,434 A * 8/1941 Kernick ................ A47J 37/048 99/441
3,257,936 A * 6/1966 Holka ................... A47J 37/041 136/212

(Continued)

FOREIGN PATENT DOCUMENTS

CN 107822514 A 3/2018
WO WO-0170087 A2 * 9/2001 .............. A47J 27/62

OTHER PUBLICATIONS

International Search Report and Written Opinion mailed Oct. 20, 2020 relating to International Appl. No. PCT/US20/43834.

(Continued)

*Primary Examiner* — Michael G Hoang
*Assistant Examiner* — Logan P Jones
(74) *Attorney, Agent, or Firm* — DINSMORE & SHOHL LLP

(57) ABSTRACT

Systems and methods for using a thermoelectric module (TEM) device include TEM(s) configured to generate electricity based on a temperature differential, a motor and shaft, and first and second roller components. The motor is coupled to the TEM(s) and configured to rotate the shaft in a first direction of rotation upon receipt of electricity from the TEM(s) based on the temperature differential. The first roller component is coupled to the shaft, which is configured to rotate the first roller component in the first direction of rotation. The second roller component is coupled to the first roller component and is configured to support a heatable item. Rotation of the first roller component in the first direction is configured to rotate the second roller component in a second direction of rotation such that the heatable item supported by the second roller component is rotated in the first direction of rotation.

10 Claims, 13 Drawing Sheets

(51) Int. Cl.

| | |
|---|---|
| ***A47J 37/04*** | (2006.01) |
| ***F23D 3/00*** | (2006.01) |
| ***F27D 5/00*** | (2006.01) |
| ***H02K 7/116*** | (2006.01) |
| ***H10N 10/17*** | (2023.01) |
| *F27D 3/00* | (2006.01) |

(52) U.S. Cl.
CPC ............. *H02K 7/116* (2013.01); *H10N 10/17* (2023.02); *F27D 2003/0067* (2013.01)

(58) Field of Classification Search
CPC ... F27D 2003/0067; F27D 5/00; H02K 7/116; H10N 10/17
See application file for complete search history.

(56) References Cited

U.S. PATENT DOCUMENTS

| | | | | |
|---|---|---|---|---|
| 3,294,010 | A * | 12/1966 | Zentko .................. | A47J 37/041 136/205 |
| 3,331,308 | A * | 7/1967 | Hoffert ................. | A47J 37/048 99/441 |
| 5,058,493 | A * | 10/1991 | Basek ................. | A47J 37/0745 99/441 |
| 7,168,363 | B1 * | 1/2007 | Brown ................ | A47J 37/0786 99/357 |
| 7,823,502 | B2 * | 11/2010 | Hecker ................. | A47J 37/042 99/421 H |
| 2007/0056577 | A1 * | 3/2007 | Chang ................. | A47J 37/0745 126/25 R |
| 2007/0283822 | A1 * | 12/2007 | Sheridan ............... | A47J 37/048 99/441 |
| 2010/0012165 | A1 | 1/2010 | Bedard | |
| 2011/0142998 | A1 * | 6/2011 | Johncock .............. | A47J 37/049 426/523 |
| 2012/0103319 | A1 | 5/2012 | Sheridan | |
| 2012/0285338 | A1 * | 11/2012 | Anderson, Sr. ....... | A47J 37/048 99/441 |
| 2013/0112187 | A1 | 5/2013 | Cedar et al. | |
| 2014/0116410 | A1 * | 5/2014 | Sorrell ...................... | F24H 9/00 126/110 R |
| 2015/0201805 | A1 * | 7/2015 | Cedar ................. | A47J 37/0786 320/101 |
| 2015/0282660 | A1 * | 10/2015 | Sarvestani .......... | A47J 37/0754 126/25 A |
| 2015/0320259 | A1 | 11/2015 | Tucker | |
| 2018/0125296 | A1 | 5/2018 | Gafford | |
| 2019/0191927 | A1 * | 6/2019 | Diffely .................. | A47J 37/048 |
| 2020/0315402 | A1 * | 10/2020 | Cretors ................ | H05B 6/1209 |

OTHER PUBLICATIONS

EP Extended European Search Report dated Aug. 2, 2023 pertaining to EP application No. 20845964.4 filed Feb. 9, 2022, pp. 1-8.

* cited by examiner

SYSTEMS AND METHODS FOR USING A THERMOELECTRIC MODULE (TEM) DEVICE FOR UNIFORM HEATING

CROSS-REFERENCE TO RELATED APPLICATIONS

The present disclosure claims the benefit of U.S. Provisional Pat. App. No. 62/879,712, entitled "PASSIVE THERMOELECTRIC ROLLER-GRILL," filed Jul. 29, 2019, the entirety of which is incorporated by reference herein.

TECHNICAL FIELD

The present specification generally relates to systems and methods for controlling heat distribution to heat items, and more particularly to systems and methods for controlling heat distribution via a thermoelectric module (TEM) device for controlling heat distribution to uniformly heat items such as a food products from a heat source such as a grill.

BACKGROUND

Grilling can often result in over and non-uniformly cooked food products. Users may walk away from a grill and come back to find food product that is unevenly cooked and burnt on different portions. Accordingly, a need exists for a device to assist with even cooking and food item burn prevention when grilling.

SUMMARY

In one embodiment, a thermoelectric module (TEM) device may include at least one TEM configured to generate electricity based on a temperature differential, a motor including a shaft, a first roller component coupled to the shaft, and a second roller component coupled to the first roller component. The motor may be coupled to the at least one TEM and configured to rotate the shaft in a first direction of rotation upon receipt of electricity from the at least one TEM based on the temperature differential. The shaft may be configured to rotate the first roller component in the first direction of rotation, and the second roller component may be configured to support a heatable item. Rotation of the first roller component in the first direction is configured to rotate the second roller component in a second direction of rotation such that the heatable item supported by the second roller component is rotated in the first direction of rotation.

A method of using a thermoelectric module (TEM) device to uniformly heat a heatable item may include disposing the TEM device on a heat source, the TEM device including at least one TEM, a motor including a shaft, a first roller component, and a second roller component, the at least one TEM configured to generate electricity based on a temperature differential induced by the heat source. The method may further include rotating the shaft in a first direction of rotation upon receipt of electricity by the motor from the at least one TEM based on the temperature differential, rotating the first roller component coupled to the shaft in the first direction of rotation upon rotation of the shaft, and rotating the second roller component coupled to the first roller component in a second direction of rotation upon rotation of the first roller component. The second roller component may be configured to support the heatable item such that the heatable item supported by the second roller component is rotated in the first direction of rotation.

A system may include a thermoelectric module (TEM) device including at least one TEM, a motor including a shaft, a first roller component, and a second roller component, a smart mobile device including a software application tool, the smart mobile device communicatively coupled to the TEM device via the software application tool, one or more processors communicatively coupled to the TEM device and the software application tool, a non-transitory memory communicatively coupled to the one or more processors, and machine readable instructions. The machine readable instructions may be stored in the non-transitory memory that cause the system to perform at least the following when executed by the one or more processors: monitor electricity generated by the at least one TEM of the TEM device based on a temperature differential, control rotation of the shaft in a first direction of rotation upon receipt of electricity by the motor from the at least one TEM based on the temperature differential, monitor rotation of the first roller component coupled to the shaft in the first direction of rotation upon rotation of the shaft, and monitor rotation of the second roller component coupled to the first roller component in a second direction of rotation upon rotation of the first roller component. The second roller component may be configured to support a heatable item such that the heatable item supported by the second roller component is rotated in the first direction of rotation.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to systems and methods for controlling heat distribution to heat items as described herein. Various embodiments of such systems and methods are described in detail herein.

For the devices described herein, thermoelectric modules (TEMs) may be thermoelectric generators, such as Seebeck generators. Seebeck generators convert temperature differences directly into electrical energy (e.g., through a Seebeck effect phenomenon in which a temperature differential between two electrically connected junctions produces an electromagnetic force between the junctions). Seebeck generators may operate in reverse such that applying a voltage to the device can cause it to act as a heater or cooler, depending on the magnitude and polarity of the voltage (e.g., through a Peltier effect phenomenon in which voltage applied across two electrically connected junctions produces a temperature differential between the junctions). The TEMs described herein operate to produce electrically energy generated from an induced temperature differential.

Figure 1:
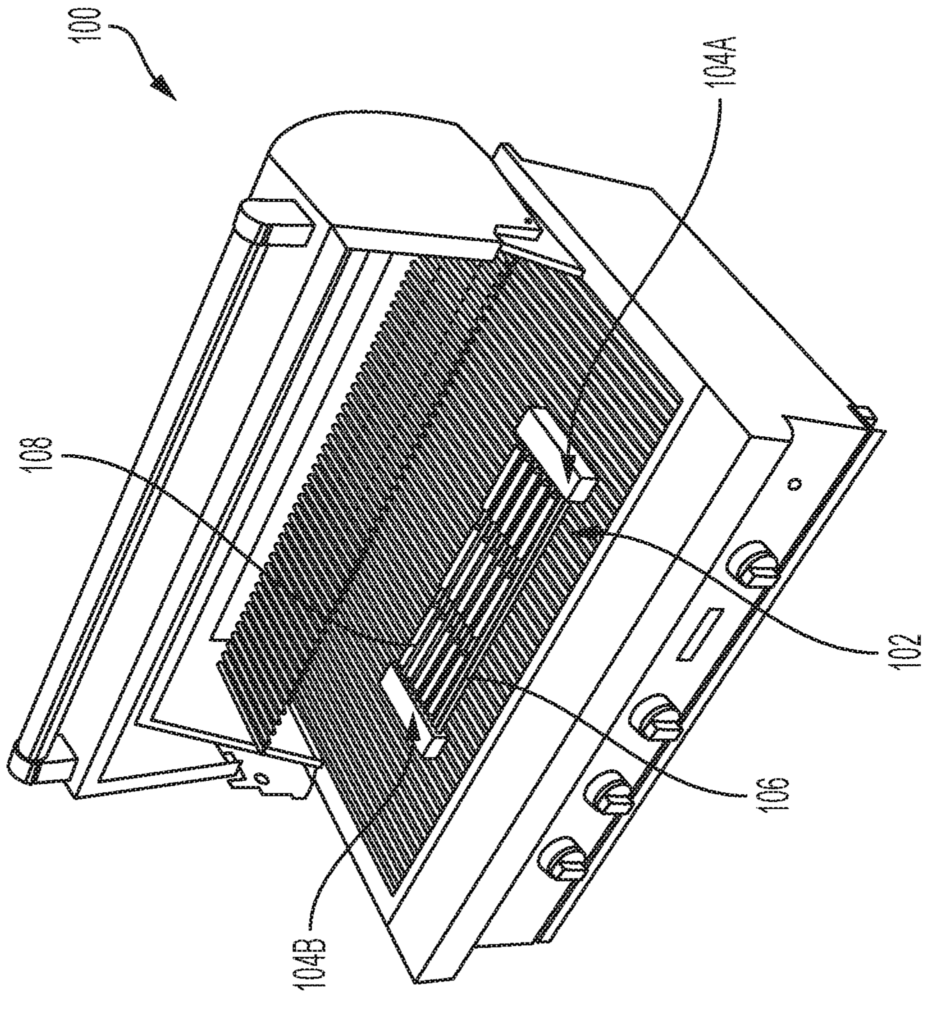
FIG. 1 is a front-side perspective view of a thermoelectric module (TEM) device on a grill, according to one or more embodiments shown and described herein.

Referring to FIG. 1, a grill 100 is shown to support a thermoelectric module (TEM) device 102. The grill 100 may support any of the TEM devices described herein, such as TEM devices 202, 302 described in greater detail further below. The TEM device 102 is disposed upon heating irons of the grill 100, which acts as a heat source for the TEM device 102. The TEM device 102 include side components 104, such as a first-side component 104A and an opposite second-side component 104B. It is contemplated by and within the scope of this disclosure that any of the side components 104, 204, 304 described herein may be interchangeable in embodiments between the first side, second side, or both of the TEM devices 102, 202, 303 as described herein.

Figure 2:
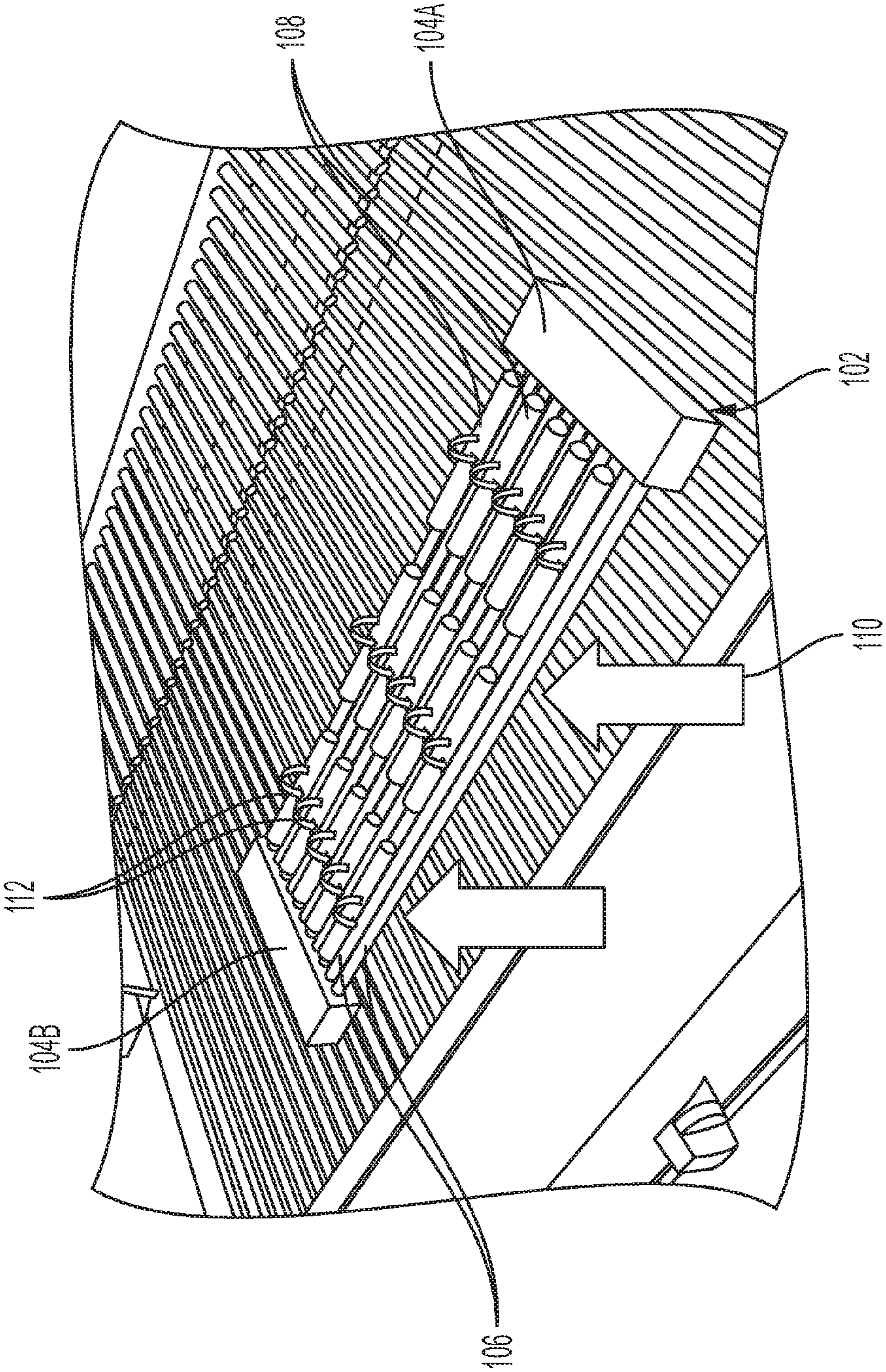
FIG. 2 is a detail view of the TEM device of FIG. 1 being used on the grill, according to one or more embodiments shown and described herein.

Referring to FIGS. 1-2, a plurality of rollers 106 are shown as disposed between the side components 104. The plurality of roller 106 are configured to hold and support a heatable item 108, such as hotdogs, for grilling on the grill 100. As will be described in greater detail below, the TEM devices 102, 202, 304 are configured to, based on a temperature differential induced by the grill 100 as the heat source, generate electricity to rotate the rollers 106, 206, 306, 306A, 356 (with respect to FIGS. 1-6 and 9) to cause a rotation of the heatable item 108. The rotation of the heatable item 108 assists to automatically, uniformly, and evenly cook the heatable item 108 in the grill 100.

As a non-limiting example, the heatable item 108 may be hot dogs disposed on the plurality of roller 108 and rotated in a direction of a plurality of rotational arrows 112 based upon heat generated by the grill 100 in the direction of heat arrows 110 to induce electricity in the TEM 102, 202, 302 devices to rotate the roller components 106, 206, 306, 306A 356 and heatable item 108 as described herein.

Figure 3:
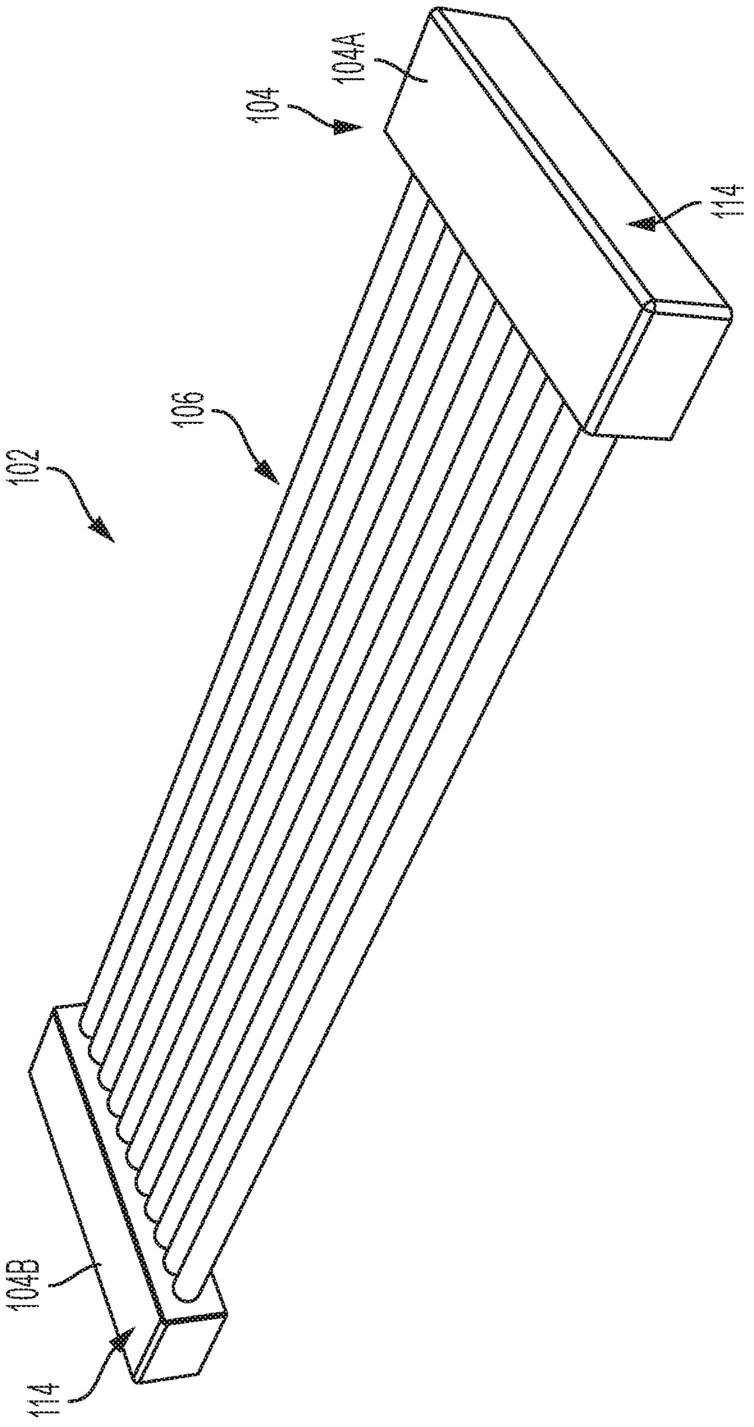
FIG. 3 is a side perspective view of an embodiment of the TEM device of FIG. 1, according to one or more embodiments shown and described herein.
Figure 4:
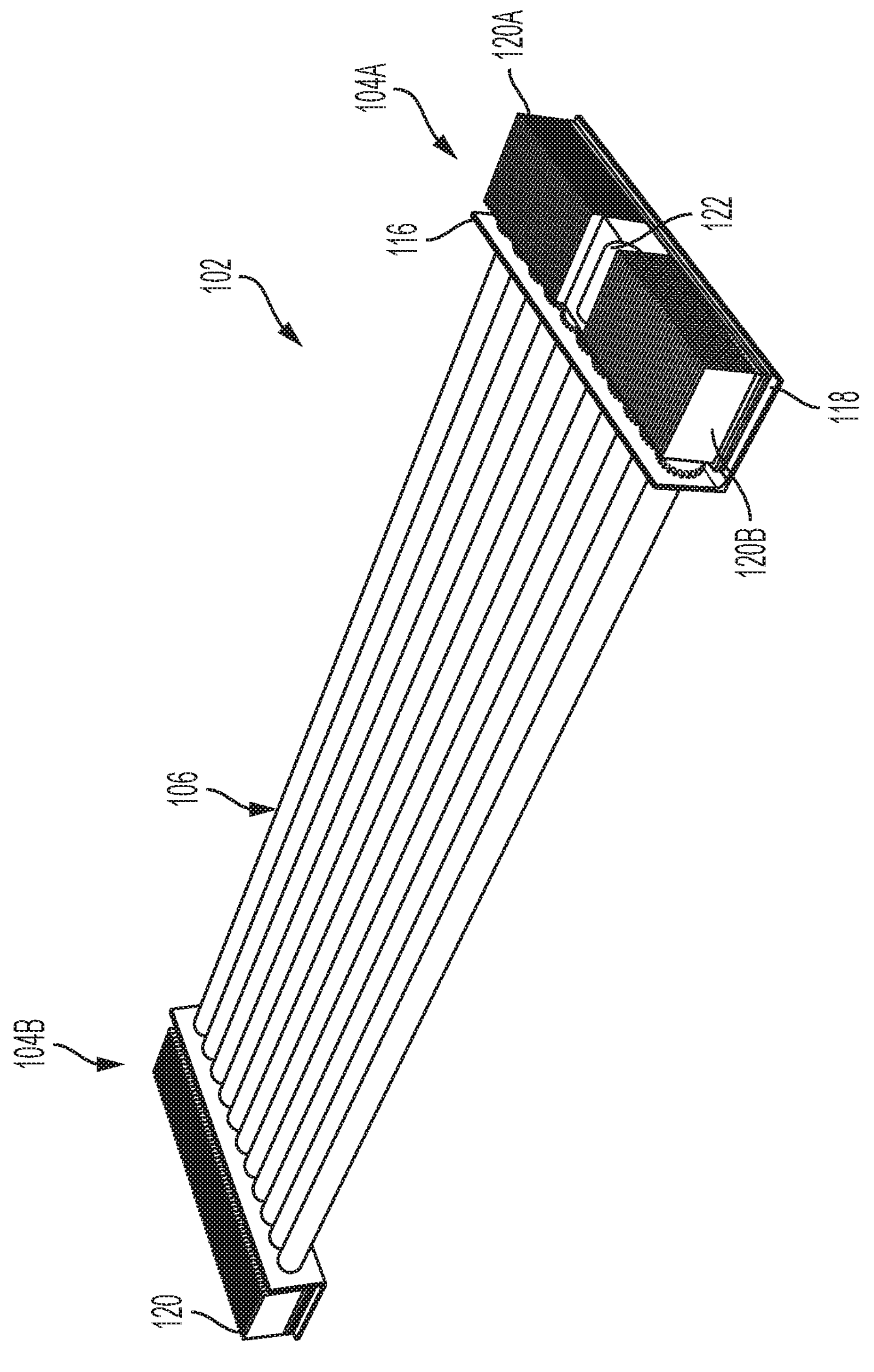
FIG. 4 is a side perspective view of the TEM device of FIG. 3 with a portion of an enclosure removed.
Figure 5:
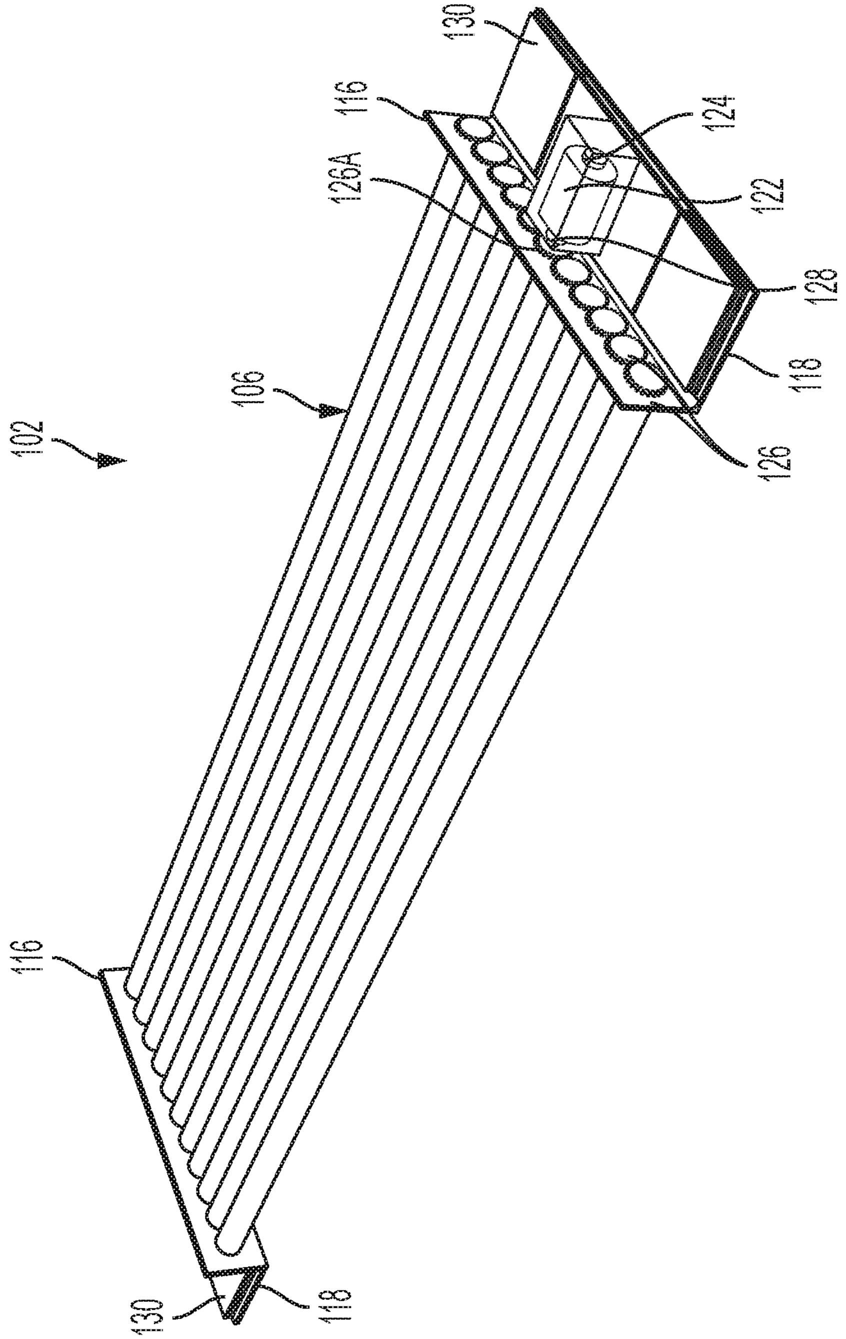
FIG. 5 is a side perspective view of the TEM device of FIG. 4 with heat sink components removed from the enclosure.

Referring to FIG. 3, the TEM device 102 may include the side components 104, include first-side component 104A and second-side component 104B. The side components 104 may each include an enclosure 114 configured to house the at least one TEM 130 as shown in FIGS. 4-5. The TEM device 102 may be rectangular in shape and include varying sizes. In an embodiment, the TEM device 102 may include a width of approximately 22 inches, a length of approximately 7 inches, and a height of approximately 2 inches, including the plurality of roller components 106 disposed between the enclosures 114A and 114B that may be waterproof.

FIGS. 4-5 depict the TEM device 102 with a portion of the enclosure 114 removed for clarity of description. The enclosure 114 includes a roller-side wall 116 and a bottom support wall 118. The roller-side wall 116 is configured to receive the plurality of rollers 106. The bottom support wall 118 is configured to be attached to and extend from a bottom of the roller-side wall 116 away from the plurality of rollers 106. The bottom support wall 118 is configured to support the at least one TEM 130. The at least one TEM 130 may be configured to support the one or more heat sink components 120, 120A, 120B and a motor housing 122 housing a motor 124. The motor 124 may be a direct current (DC) motor, though an alternating current (AC) motor is contemplated by and within the scope of this disclosure. The one or more heat sink components 120, 120A, 120B are configured to dissipate heat from the heat source and the at least one TEM 130. The one or more heat sink components 120, 120A, 120B may be configured to absorb heat off the at least one TEM 130 and dissipate the heat upwardly towards a top of the TEM device 102.

The motor housing 122 may include a heat shield further configured to protect the motor 124 from overheating and provide heat protection around the motor 124 and explore wiring connections. As will be described in greater detail below, the motor 124 is coupled to a shaft 128, which is coupled to a motor gear 126A to drive an adjacent gear 126 of a plurality of gears 126. As the plurality of gears 126 are respectively coupled to the plurality of roller components 106, a rotation of a gear 126 drives a respective rotation of a roller component 106 as described herein. One or more roller components as described herein, such as the plurality of roller components 106 may be made of a food grade stainless steel and may be, for example, a 304 or 316 or comparable stainless steel. Each roller component may be a cylinder or other suitable shape.

Referring to FIG. 5, the TEM device 102 includes the at least one TEM 130 configured to generate electricity based on a temperature differential, which may be induced from a heat source such as the grill 100. The TEM device 102 further includes the motor 124 including the shaft 128. The motor 124 is coupled to the at least one TEM 130 and configured to rotate the shaft 128 in a first direction of rotation upon receipt of electricity from the at least one TEM 130 based on the temperature differential.

The TEM device 102 includes a first roller component 106 coupled to the shaft 128. The shaft 128 is configured to rotate the first roller component 106 in the first direction of rotation, such as shown by rotational arrows 112 of FIG. 2.

The TEM device 102 includes a second roller component 106 coupled to the first roller component 106. The second roller component 106 may be configured to support a heatable item 108, such as a food product. The food product may be a hot dog, chicken, sausage, burrito, or the like. In embodiments, the heat product may include clay material such that the TEM device 102 may be used for oven type operations to bake clay and create pottery.

Rotation of the first roller component 106 in the first direction may be configured to rotate the second roller component 106 in a second direction of rotation such that the heatable item 108 supported by the second roller component 106 is rotated in the first direction of rotation, such as in the direction of rotational arrows 112 of FIG. 2. In the embodiment of FIG. 2, the first direction of rotation is different from the second direction of rotation. In another embodiment described herein, such as with respect to the TEM device 302 of FIG. 9 described in great detail further below, the first direction of rotation is the same as the second direction of rotation.

Referring again to FIGS. 2-3, the TEM device 102 may include the side component 104, 104A, 104B including the enclosure 114 configured to house the at least one TEM 130. The side component 104, 104A, 104B may be integral with the enclosure. The enclosure 114 may further be configured to house the motor 124, one or more heat sink components 120, 120A, 120B, and a motor housing 122. The motor housing 122 is configured to house the motor 124. The motor housing 122 may be made of a heat shield, such as a material configured to shield the motor from heat.

Referring again to FIG. 5, the first roller component 106 and the second roller component 106 may be part of the plurality of roller components 106. The side component 104 may include the plurality of gears 126 configured to couple to the plurality of roller components 106. The plurality of gears 126 may include the motor gear 126A and at least one adjacent gear 126 coupled to the motor gear 126A and the second roller component 106. The motor gear 126A may be coupled to the first roller component 106 and the shaft 128 such that rotation of the shaft 128 in the first direction (e.g., in the direction of rotational arrows 112) is configured to rotate the motor gear 126A in the first direction to rotate the at least one adjacent gear 126 in the second direction, which may be opposite the first direction. As a non-limiting embodiment, the plurality of gears 126 may each include a pinion (e.g., a circular gear). The pinion may include a plurality of teeth, such that each tooth of the plurality of teeth of the motor gear 126A is configured to engage an adjacent tooth of the plurality of teeth of the at least one adjacent gear 126 during rotation.

Figure 6:
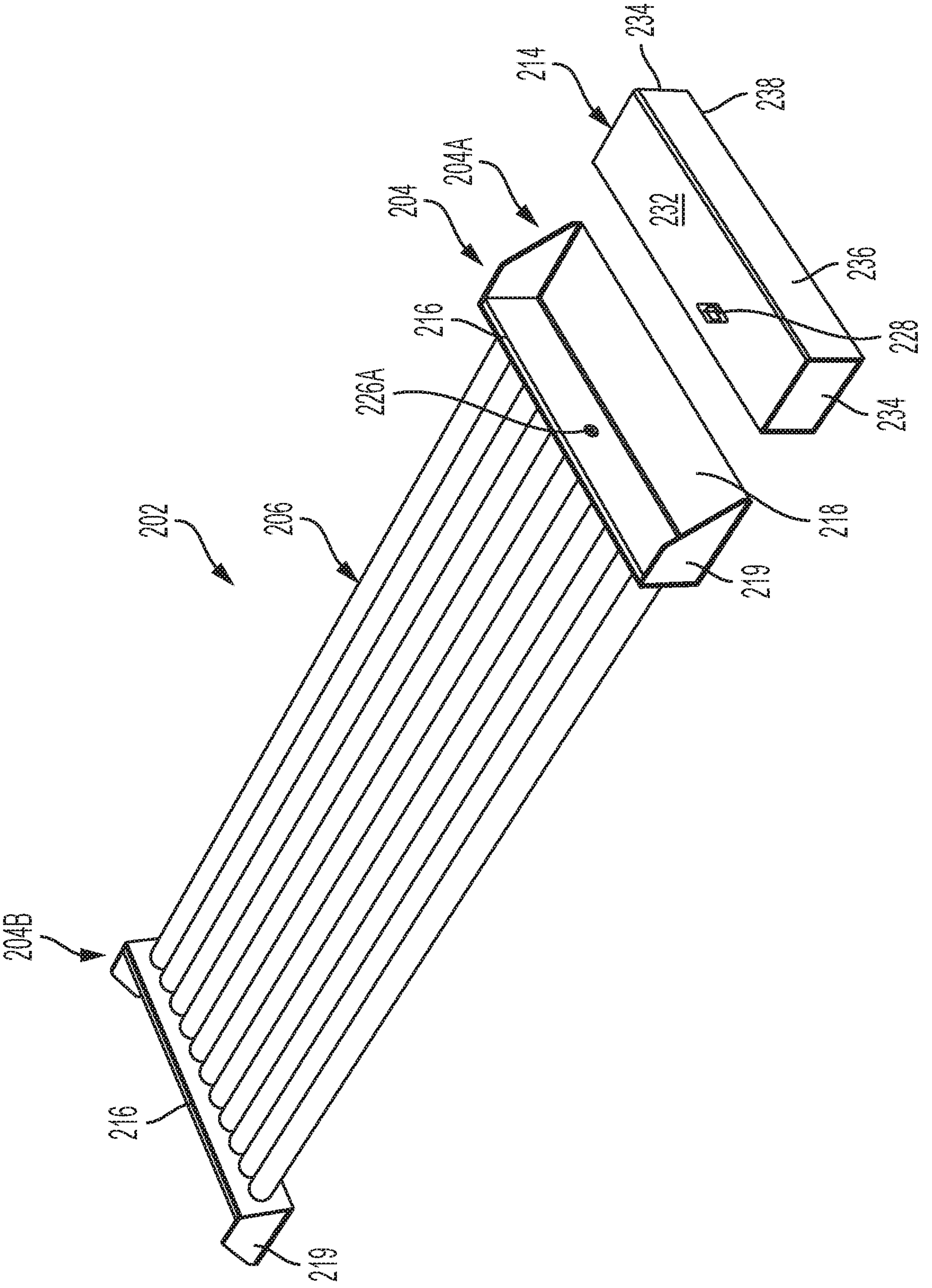
FIG. 6 is a side perspective view of another TEM device including a motor side component including an enclosure, according to one or more embodiments shown and described herein.
Figure 7:
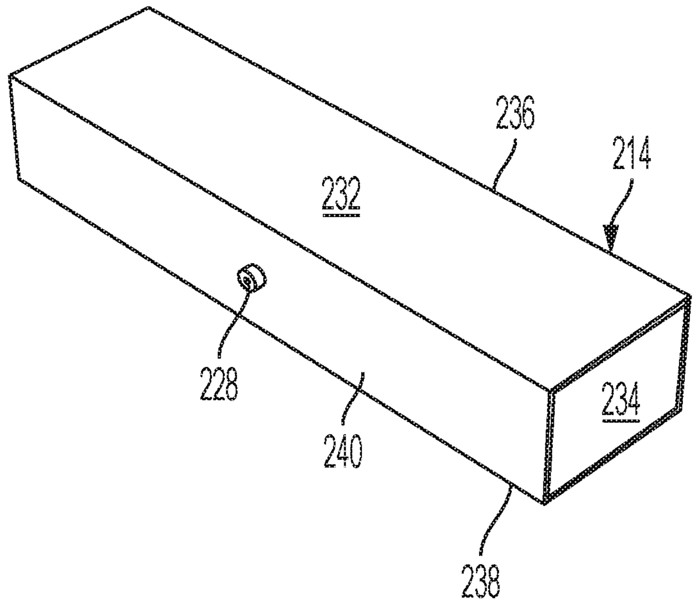
FIG. 7 is a side perspective view of the motor side component of FIG. 6 with the enclosure.
Figure 8:
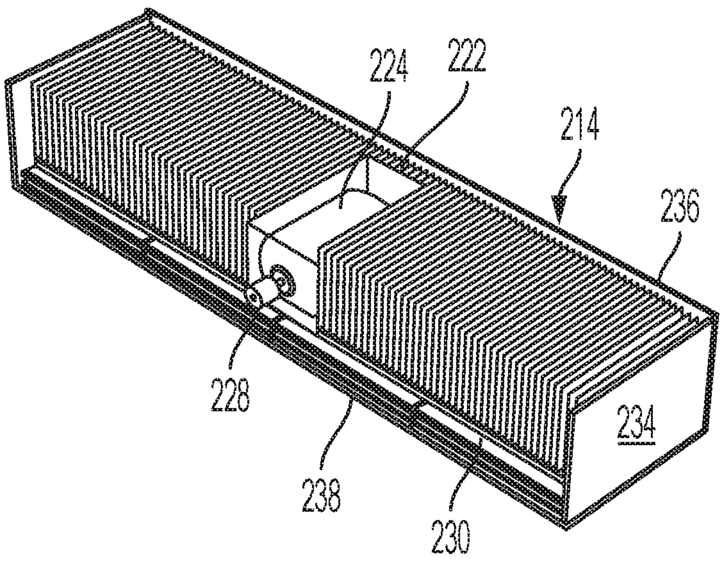
FIG. 8 is a side perspective view of the motor side component of FIG. 6 with a portion of the enclosure removed.

In the embodiment of FIGS. 6-8, the TEM device 202 is configured to include a side component 204 to receive an enclosure 214 including an integrated motor, such as a motor 224. Referring to FIG. 6, the TEM device 202 includes at least one TEM 230 configured to generate electricity based on the temperature differential. As shown in FIGS. 7-8, the TEM device 202 further includes the motor 224 including a shaft 228. The motor 224 is coupled to the at least one TEM 230 and configured to rotate the shaft 228 in a first direction of rotation upon receipt of electricity from the at least one TEM 230 based on the temperature differential.

The TEM device 202 includes a first roller component 206 coupled to the shaft 228. The shaft 228 is configured to rotate the first roller component 206 in the first direction of rotation. The TEM device 202 includes a second roller component 206 coupled to the first roller component 206. The second roller component 206 may be configured to support the heatable item 108.

Rotation of the first roller component 206 in the first direction may be configured to rotate the second roller component 206 in a second direction of rotation such that the heatable item 108 supported by the second roller component 206 is rotated in the first direction of rotation. Similar to the embodiment of FIG. 2, the first direction of rotation with respect to the TEM device 202 may be different from the second direction of rotation.

Referring to FIG. 6, the TEM device 202 may include a side component 204, 204A, 204B including an enclosure 214 that is configured to house the at least one TEM 230. The side component 204, 204A, 204B may be configured to receive the enclosure 214. As shown in FIG. 8, the enclosure 214 may be configured to house the motor 224 via a motor housing 222.

The side component 204, 204A, 204B may include a roller-side wall 216, a bottom support wall 218, and a pair of side walls 219. The roller-side walls 216 may be configured to receive roller components 206. The bottom support wall 218 may be configured to be attached to and extend from a bottom of the roller-side wall 216 away from the rollers 206. The pair of side wall 219 may be disposed between end portions of the roller-side wall 216 and the bottom support wall 218. The roller-side wall 216, the bottom support wall 218, and the pair of side walls 219 may be sized and shaped and configured to receive and hold the enclosure 214.

The enclosure 214 may include a top surface wall 232, a pair of interior side surface walls 234, an outer side surface wall 236, a bottom surface wall 238, and an inner side surface wall 240. The bottom surface wall 238 may be configured for receipt by and a flush contact by the bottom support wall 218 of the side component 204. The pair of interior side surface walls 234 may be configured for receipt by and a flush contact against the pair of side walls 219. The inner side surface wall 240 may be configured for receipt by and a flush contact against the roller-side wall 216 when the side component 204 receives and is coupled to the enclosure 214. Referring to FIGS. 7-8, the bottom surface wall 238 of the enclosure 214 is configured to support the at least one TEM 230. The TEM 230 may support one or more heat sink components and the motor housing 222. The motor housing 222 is configured to house the motor 224, from which a shaft 228 extends. The shaft 228 is configured to couple with a motor gear 226A (FIG. 6) of the side component 204 to rotate a corresponding roller component 206 as described herein.

Figure 9:
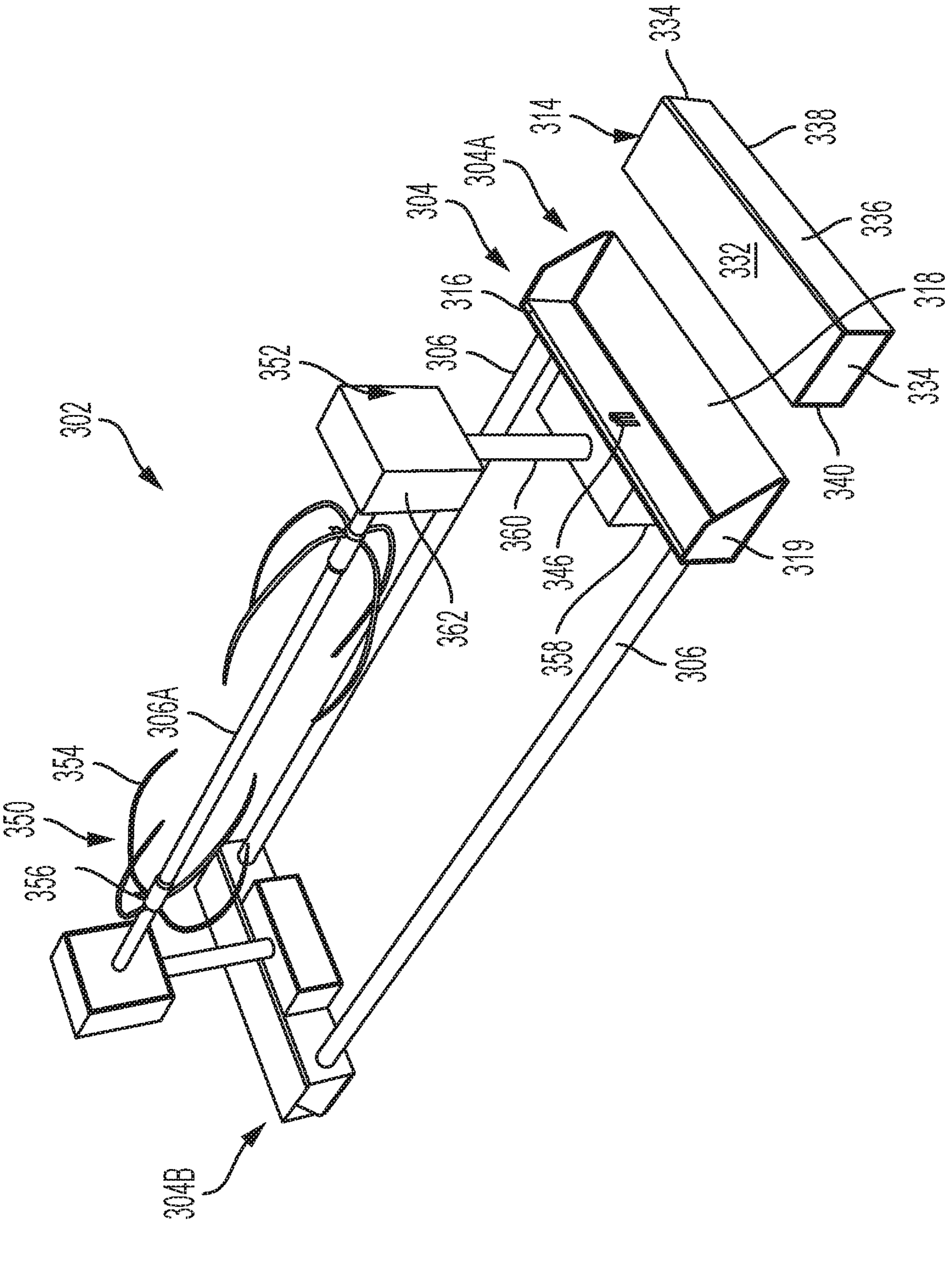
FIG. 9 is a is a front-side perspective view of a TEM device with a power side component including an enclosure, according to one or more embodiments shown and described herein.
Figure 10:
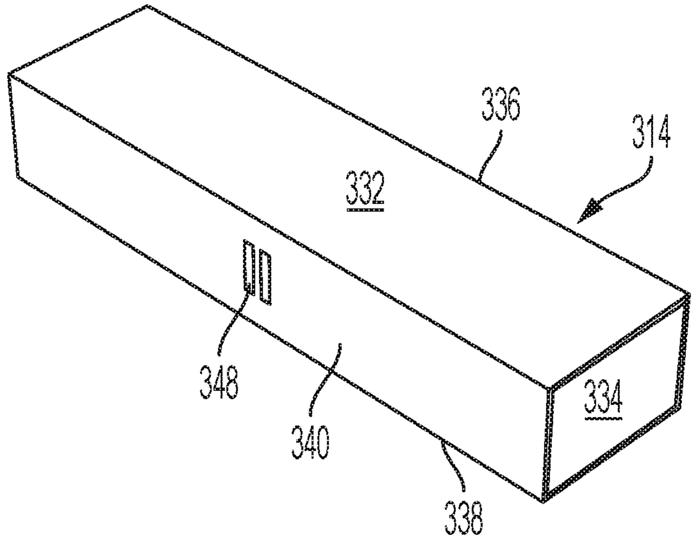
FIG. 10 is a side perspective view of the power side component of FIG. 9 with the enclosure.
Figure 11:
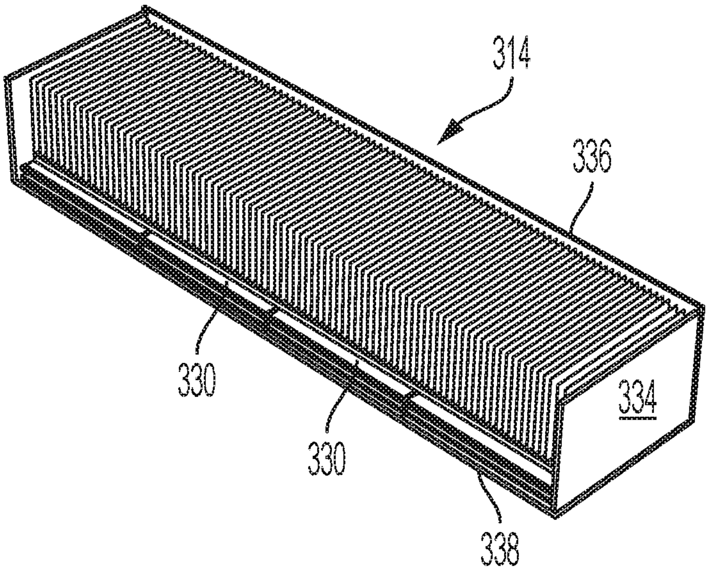
FIG. 11 is a side perspective view of the motor side component of FIG. 9 with a portion of the enclosure removed.
Figure 12:
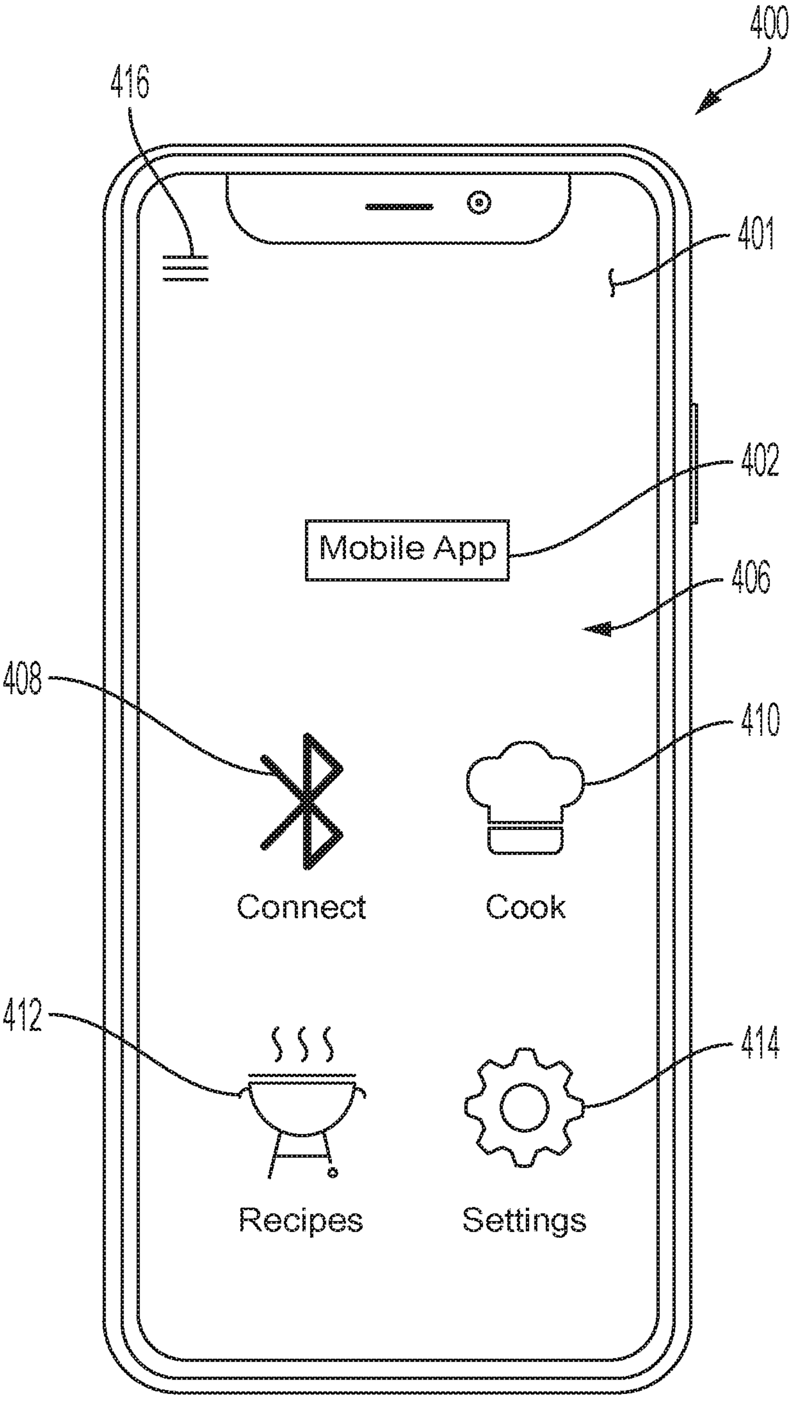
FIG. 12 is a front view of a first screen of a TEM device control application tool on a mobile device, according to one or more embodiments shown and described herein.

In the embodiment of FIGS. 9-11, the TEM device 302 is configured to include a side component 304, 304A, 304B to receive an enclosure 314 that is separate from and electrically coupled to a motor 362 configured to rotate the roller component 306A. The enclosure 314 acts as a power source for a motor 362 as described herein. Referring to FIG. 9, the TEM device 302 includes at least one TEM 330 configured to generate electricity by the enclosure 314 as the power source based on the temperature differential. The TEM device 302 further includes the motor 362 including a shaft (e.g., similar to motors 124, 224 with shafts 128, 228). The motor 362 is coupled to the at least one TEM 330, such as through an electrical communication, and is configured to rotate the shaft in a first direction of rotation upon receipt of electricity from the at least one TEM 330 based on the temperature differential.

The side component 304, 304A, 304B may include a roller-side wall 316, a bottom support wall 318, and a pair of side walls 319. The roller-side walls 316 may be configured to receive roller components 306. The bottom support wall 318 may be configured to be attached to and extend from a bottom of the roller-side wall 316 away from the rollers 306. The pair of side wall 319 may be disposed between end portions of the roller-side wall 316 and the bottom support wall 318. The roller-side wall 316, the bottom support wall 318, and the pair of side walls 319 may be sized and shaped and configured to receive and hold the enclosure 314.

The enclosure 314 may include a top surface wall 332, a pair of interior side surface walls 334, an outer side surface wall 336, a bottom surface wall 338, and an inner side surface wall 340. The bottom surface wall 338 may be configured for receipt by and a flush contact by the bottom support wall 318 of the side component 304. The pair of interior side surface walls 334 may be configured for receipt by and a flush contact against the pair of side walls 319. The inner side surface wall 340 may be configured for receipt by and a flush contact against the roller-side wall 316 when the side component 304 receives and is coupled to the enclosure 314. Referring to FIGS. 10-11, the bottom surface wall 338 of the enclosure 314 is configured to support the at least one TEM 330.

Referring again to FIG. 9, the side component 306 further includes a current receiver 346 configured to receive electricity generated by the enclosure 114 as described herein. As shown in FIGS. 10-11, a current supplier 348 of the enclosure 114 is configured to couple with the current receiver 346 when the side component 304 receives and is coupled to the enclosure 314.

As shown in FIG. 9, a prong assembly 350 includes a roller component 356 and a plurality of prongs 354 configured to grip a heatable item 108, such as a rotisserie chicken. The prong assembly 350 is configured to be rotated via motor assembly 352 by power provided by the current supplier 314 to the current receiver 346 through the at least one TEM 330 as described herein. Electricity as current from the current receiver 346 electrically flows to a current assembly 358, which is coupled to a stand assembly 360 attached to the motor assembly 352. The motor assembly 352 includes a motor 362 configured to drive the roller component 306A, which effects a corresponding rotation in the roller component 356 of the prong assembly 350.

The bottom support wall 318 may be configured to support the at least one TEM 330. The at least one TEM 130 may be configured to support the one or more heat sink components 120, 120A, 120B and a motor housing 122 housing a motor 124. The one or more heat sink components 120, 120A, 120B are configured to dissipate heat from the heat source and the at least one TEM 130. The motor housing 122 may include a heat shield further configured to protect the motor 124 from overheating. As will be described in greater detail below, the motor 124 is coupled to a shaft 128, which is coupled to a motor gear 126A to drive an adjacent gear 126 of a plurality of gears 126. As the plurality of gears 126 are respectively coupled to the plurality of roller components 106, a rotation of a gear 126 drives a respective rotation of a roller component 106 as described herein.

The TEM device 302 includes a first roller component 306A coupled to the shaft, which is configured to rotate the first roller component 306A in the first direction of rotation. The TEM device 302 includes a second roller component 356 coupled to the first roller component 306A. The second roller component 356 may be configured to support the heatable item 108.

Rotation of the first roller component 306A in the first direction may be configured to rotate the second roller component 356 in a second direction of rotation such that the heatable item 108 supported by the second roller component 356 is rotated in the first direction of rotation. The first roller component 306A may be integral with the second roller component 356. In other embodiments, the first roller component 306A may be coupled to the second roller component 356. As a non-limiting example, the second roller component 356 may be a roller ring disposed on the first roller component 306A.

In an embodiment, the first direction of rotation may be the same as the second direction of rotation. In other embodiments, the first direction of rotation with respect to the TEM device 302 may be different from the second direction of rotation. As a non-limiting example, a gear system may be disposed between the first roller component 306A and the second roller component 356 to effect opposite directions of rotation.

The TEM device 302 may include a side component 304, 304A, 304B including an enclosure 314 that is configured to house the at least one TEM 330. The side component 304, 304A, 304B may be configured to receive the enclosure 314. The TEM device 302 may include a motor assembly 352 separate from the side component 304, 304A, 304B. The motor assembly 352 may be configured to house the motor 362. The second roller component 356 may include a plurality of prongs 354. The plurality of prongs 354 may be configured to support and hold the heatable item 108, which may be, for example, a rotisserie chicken.

It is contemplated by and within the scope of this disclosure that the TEM devices 102, 202, and 302 may similarly be applied to a conveying device in which at least one TEM 130, 230, 330 is utilized to generate and provide electricity from a temperature differential as induced by a heat source to a conveying system within one or more conveyor belts operated via the motion of one or more rollers driven by a motor powered by the generated electricity. Heatable items 108 that may be prepared by the conveying system may be, for example, pizza, burgers, and the like in which an upper and lower surface are uniformly heated by the conveying system powered and driven by TEM device as described herein. In embodiments, the TEM devices 102, 202, and 302 may include a back-up power source option, such as a connection to power supply and/or a battery. The side components 104, 204, 304 and associated enclosures 114, 214, and 314 described herein may comprise a material that is water-proof and machine washable for longevity of use and ease of cleaning (e.g., via automated dishwashing and/or manual handwashing) while protecting internally contained components. The side components 104, 204, 304 may be made of a stainless steel material. Portions of the TEM device 102, 202, 302 may be made of stainless steel and/or silicone (Si) to provide water resistance and/or heat protection.

In embodiments, the first direction may be the same or different from as the second direction. Further, with reference to FIGS. 1-11, the roller components 106, 206, 306, 306A, and 356 may be configured to be interchangeable. By way of example, and not as a limitation, the first roller component 106, 206, 306A and the second roller component 106, 206, 356 are configured to be interchangeable with the TEM device 102, 202, 302, integral with the TEM device 102, 202, 302, or combinations thereof. Further, the roller components 106, 206, 306, 306A, and 356 may include varying sizes and shapes or may be of a uniform size and shape with respect to one another.

In some embodiments, the at least one TEM 130, 230, 330 is configured to charge a battery coupled to the motor 124, 224, 362. The motor 124, 224, 362 may be configured to rotate the shaft 128, 228 in the first direction of rotation via electricity from the battery when the temperature differential is not sufficient to activate the at least one TEM 130, 230, 330. In an embodiment, the motor 124, 224, 362 may be configured to receive the electrical current to operate at a speed to rotate the coupled roller components 106, 206, 306, 306A, and 356 at a rate of approximately 4 to 6 revolutions per minute.

Referring to FIGS. 1-11, a method of using the TEM device 102, 202, 302 to uniformly heat the heatable item 108 may include disposing the TEM device 102, 202, 302 on a heat source such as the grill 100. The TEM device 102, 202, 302, may include the at least one TEM 130, 230, 330, the motor 124, 224, 362 including a shaft 128, 228, a first roller component 106, 206, 306, 306A, and a second roller component 106, 206, 356. The at least one TEM 130, 230, 330 may be configured to generate electricity based on a temperature differential induced by the heat source such as the grill 100.

The method may further include rotating the shaft 128, 228 in a first direction of rotation (e.g., in the direction of the rotational arrows 112) upon receipt of electricity by the motor 124, 224, 362 from the at least one TEM 130, 230, 330 based on the temperature differential. The first roller component 106, 206, 306, 306A coupled to the shaft 128, 228 may be rotated in the first direction of rotation upon rotation of the shaft 128, 228. The second roller component 106, 206, 356 coupled to the first roller component 106, 206, 306, 306A may be rotated in a second direction of rotation upon rotation of the first roller component 106, 206, 306, 306A. The second roller component 106, 206, 356 may be configured to support the heatable item 108 such that the heatable item 108 supported by the second roller component is rotated in the first direction of rotation.

The first direction may be the same as or different from the second direction. Further, the first roller component 106, 206, 306, 306A and the second roller component 106, 206, 356 may be configured to be interchangeable with the TEM device, integral with the TEM device, or combinations thereof. As described above, the TEM device 102, 202, 303 may further include the side component 104, 204, 304 including the enclosure 114, 214, 314 configured to house the at least one TEM 130, 230, 330. As shown in FIGS. 1-5, the side component 104 may be integral with the enclosure 114. As shown in FIGS. 6-11, the side component 204, 304 may be configured to receive the enclosure 214, 314.

Figure 15:
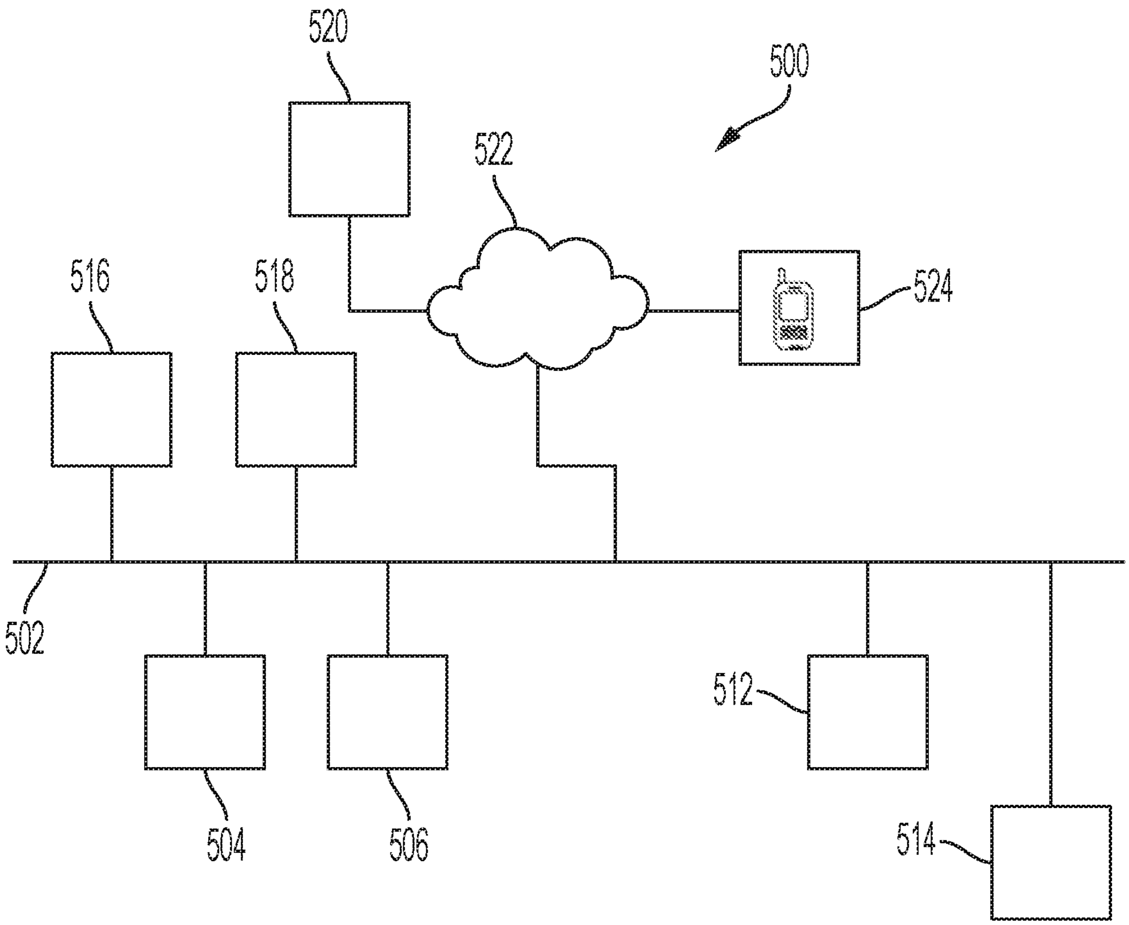
FIG. 15 schematically illustrates a system for implementing computer and software based methods to utilize the TEM device of FIGS. 1-11 and TEM device control application tool of FIGS. 12-14, according to one or more embodiments shown and described herein.

Referring to FIG. 15, a system 500 for implementing a computer and software-based method to implement the processes described herein is illustrated. The system 500 may be implemented along with using a graphical user interface (GUI) that is accessible at a mobile client device (e.g., a smart mobile device 400), for example. The mobile client device may be a smart mobile device, which may be a smartphone, a tablet, or a like portable handheld smart device. The machine readable instructions may cause the system 500 to, when executed by the processor, interact with the mobile client device to follow one or more control schemes as set forth in the one or more processes described herein.

The system 500 includes machine readable instructions stored in non-transitory memory that cause the system 500 to perform one or more of instructions when executed by the one or more processors, as described in greater detail below. The system 500 includes a communication path 502, one or more processors 504, a memory 506, a speed component 512, a storage or database 514, one or more sensors 516, a network interface hardware 518, a server 520, a network 522, and a mobile client device 524. The various components of the system 500 and the interaction thereof will be described in detail below.

In some embodiments, the system 500 is implemented using a wide area network (WAN) or network 522, such as an intranet or the Internet, or other wired or wireless communication network that may include a cloud computing-based network configuration. The mobile client device 524 may include digital systems and other devices permitting connection to and navigation of the network, such as the smart mobile device. Other system 500 variations allowing for communication between various geographically diverse components are possible. The lines depicted in FIG. 15 indicate communication rather than physical connections between the various components.

As noted above, the system 500 includes the communication path 502. The communication path 502 may be formed from any medium that is capable of transmitting a signal such as, for example, conductive wires, conductive traces, optical waveguides, or the like, or from a combination of mediums capable of transmitting signals. The communication path 502 communicatively couples the various components of the system 500. As used herein, the term "communicatively coupled" means that coupled components are capable of exchanging data signals with one another such as, for example, electrical signals via conductive medium, electromagnetic signals via air, optical signals via optical waveguides, and the like.

As noted above, the system 500 includes the processor 504. The processor 504 can be any device capable of executing machine readable instructions. Accordingly, the processor 504 may be a controller, an integrated circuit, a microchip, a computer, or any other computing device. The processor 504 is communicatively coupled to the other components of the system 500 by the communication path 502. Accordingly, the communication path 502 may communicatively couple any number of processors with one another, and allow the modules coupled to the communication path 502 to operate in a distributed computing environment. Specifically, each of the modules can operate as a node that may send and/or receive data. The processor 504 may process the input signals received from the system modules and/or extract information from such signals.

As noted above, the system 500 includes the memory 506, which is coupled to the communication path 502, and communicatively coupled to the processor 504. The memory 506 may be a non-transitory computer readable medium or non-transitory computer readable memory and may be configured as a nonvolatile computer readable medium. The memory 506 may comprise RAM, ROM, flash memories, hard drives, or any device capable of storing machine readable instructions such that the machine readable instructions can be accessed and executed by the processor 504. The machine readable instructions may comprise logic or algorithm(s) written in any programming language such as, for example, machine language that may be directly executed by the processor, or assembly language, object-oriented programming (OOP), scripting languages, microcode, etc., that may be compiled or assembled into machine readable instructions and stored on the memory 506. Alternatively, the machine readable instructions may be written in a hardware description language (HDL), such as logic implemented via either a field-programmable gate array (FPGA) configuration or an application-specific integrated circuit (ASIC), or their equivalents. Accordingly, the methods described herein may be implemented in any computer programming language, as pre-programmed hardware elements, or as a combination of hardware and software components. In embodiments, the system 500 may include the processor 504 communicatively coupled to the memory 506 that stores instructions that, when executed by the processor 504, cause the processor to perform one or more functions as described herein.

Still referring to FIG. 15, as noted above, the system 500 may comprise the display such as a GUI on a respective screen of the mobile client device 524 for providing visual output and/or receiving input such as a dialed number on a touchscreen interface. The mobile client devices 524 may include one or more computing devices across platforms, or may be communicatively coupled to devices across platforms, such as smart mobile devices including smartphones, tablets, laptops, and the like. The display on the screen of the mobile client device 524 is coupled to the communication path 502 and communicatively coupled to the processor 504. Accordingly, the communication path 502 communicatively couples the display to other modules of the system 500. The display can include any medium capable of transmitting an optical output such as, for example, a cathode ray tube, light emitting diodes, a liquid crystal display, a plasma display, or the like. Additionally, it is noted that the display or the mobile client device 524 can be communicatively coupled to at least one of the processor 504 and the memory 506. While the system 500 is illustrated as a single, integrated system in FIG. 15, in other embodiments, the systems can be independent systems and/or sub-systems.

The system 500 may comprise: (i) the speed component 512 configured to control a speed of the motor to effect a roller component speed of rotation and (ii) one or more sensors 516, which may be heat sensors and the like as described herein. The speed component 512 and the one or more sensors 516 are coupled to the communication path 502 and communicatively coupled to the processor 504. The processor 504 may process the input signals received from the system modules and/or extract information from such signals.

Data stored and manipulated in the system 500 as described herein may be used to leverage a cloud computing-based network configuration such as the Cloud. The system 500 includes the network interface hardware 518 for communicatively coupling the system 500 with a computer network such as network 522, which may comprise the Cloud. The network interface hardware 518 is coupled to the communication path 502 such that the communication path 502 communicatively couples the network interface hardware 518 to other modules of the system 500. The network interface hardware 518 can be any device capable of transmitting and/or receiving data via a wireless network. Accordingly, the network interface hardware 518 can include a communication transceiver for sending and/or receiving data according to any wireless communication standard. For example, the network interface hardware 518 can include a chipset (e.g., antenna, processors, machine readable instructions, etc.) to communicate over wired and/or wireless computer networks such as, for example, wireless fidelity (Wi-Fi), WiMax, Bluetooth, IrDA, Wireless USB, Z-Wave, ZigBee, or the like.

Still referring to FIG. 15, data from various applications running on mobile client device 524 can be provided to the system 500 via the network interface hardware 518. The mobile client device 524 can be any device having hardware (e.g., chipsets, processors, memory, etc.) for communicatively coupling with the network interface hardware 518 and a network 522. Specifically, the mobile client device 524 can include an input device having an antenna for communicating over one or more of the wireless computer networks described above.

The network 522 can include any wired and/or wireless network such as, for example, wide area networks, metropolitan area networks, the Internet, an Intranet, a cloud server (e.g., the Cloud), satellite networks, or the like. Accordingly, the network 522 can be utilized as a wireless access point by the mobile client device 524 to access one or more servers 520 (e.g., of the Cloud). Accessed servers, such as a cloud server, generally include processors, memory, and chipset for delivering resources via the network 522. Resources can include providing, for example, processing, storage, software, and information from the one or more servers 520 to the system 500 via the network 522. Additionally, it is noted that the one or more servers 520 can share resources with one another over the network 522 such as, for example, via the wired portion of the network 522, the wireless portion of the network 522, or combinations thereof.

Referring to FIGS. 12-15, the system 500 may include the TEM device 102, 202, 302, a smart mobile device 400 (e.g., as the mobile client device 524), one or more processors 504, a memory 506 as a non-transitory memory communicatively coupled to the one or more processors 504, and machine readable instructions stored in the non-transitory memory. The TEM device 102, 202, 302 may include the at least one TEM 130, 230, 330, the motor 124, 224, 362 including the shaft 128, 228, the first roller component 106, 206, 306, 306A, and the second roller component 106, 206, 356 as described herein. The smart mobile device 400 may include a software application tool 402. The smart mobile device 400 may be communicatively coupled to the TEM device 102, 202, 302 via the software application tool 402. The one or more processors 504 may be communicatively coupled to the TEM device 102, 202, 302 and the software application tool 402.

The software application tool 402 may include a graphical user interface (GUI) 402. The GUI 401 may include a display 406 including, but not limited to, a connect feature 408, a cook feature 410, a recipe feature 412, a settings feature 414, and a menu feature 416. The connect feature 408 may be configured to provide options to communicatively connect the TEM device 102, 202, 302 and/or the grill 100 to the software application tool 402. The cook feature 410 may be configured to provide information to a user regarding cooking status of a heatable item 108 disposed on a grill 100 and supported by the TEM 102, 202, 302. The recipe feature 412 may be configured to provide recipes to a user for one or more dishes and/or instructions to cook the heatable item 108. The settings feature 414 may be configured to provide access to one or more settings to control for the software application tool 402. The menu feature 416 is configured to provide options with respect to the software application tool 402, such as options to navigate between different screens of the display 406 of the software application tool 402, options to access and/or edit user account information, previous cooking history data, and the like.

Figure 13:
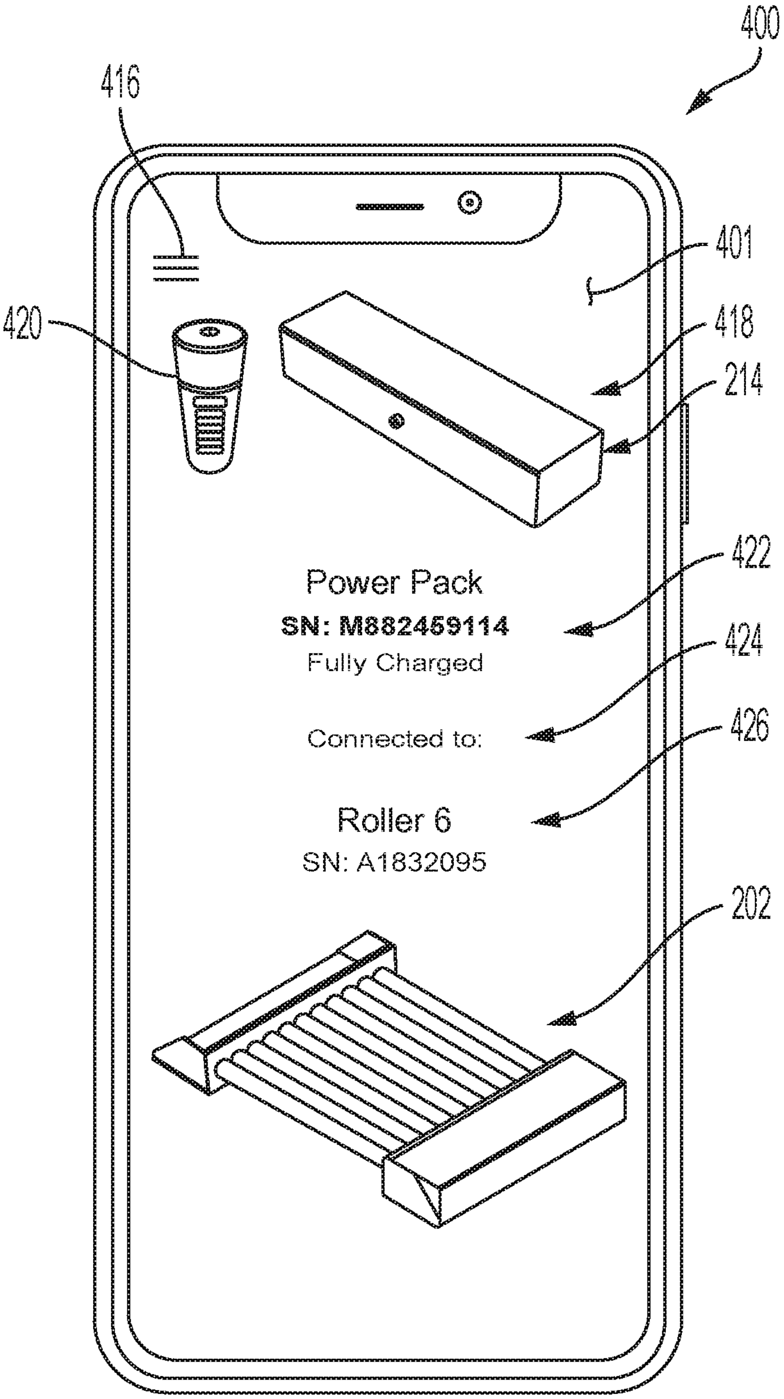
FIG. 13 is a front view of a second screen of the TEM device control application tool of FIG. 12.

In an embodiment shown in FIG. 13, the GUI 401 may include a display 406 including an image 418, a battery level icon 420, a side component information feature 422, a connection feature 424, and a device type information feature 426. The image 418 may be of a type of enclosure 114, 214, 314 to which the software application tool 402 is connected. As a non-limiting example, the enclosure 214 of FIGS. 6-8 is depicted. The battery level icon 420 is configured to show a level of a battery that may be charged during use of the TEM device 102, 202, 302, and be used as a back-up power supply device to power the motor 124, 224, 362. In an embodiment, stasis may occur such that a temperature differential is not produced to generate electricity by the at least one TEM 130, 230,330, such as when a cover of the grill 100 may be closed and a temperature becomes generally uniform. In such a situation, the battery may be activity once a temperature differential is insufficient to cause the at least one TEM 130, 230, 330 to generate electricity. In embodiments, the TEM device 102, 202, 302 may be used with an auxiliary power source such as a power cord to plug into a voltage source power supply and/or the battery described herein.

The side component information feature 422 may be configured to provide side component information for the associated TEM device 102, 202, 302, such as charge status, serial number, and type. The connection feature 424 may be configured to provided connection information, such as the type of TEM device 102, 202, 302 to which the side component is connected. The device type information feature 426 is configured to provide information regarding the type of TEM device 102, 202, 302, such as a serial number and an image. The image is shown as an image of TEM device 202 in the embodiment of FIG. 13.

Figure 14:
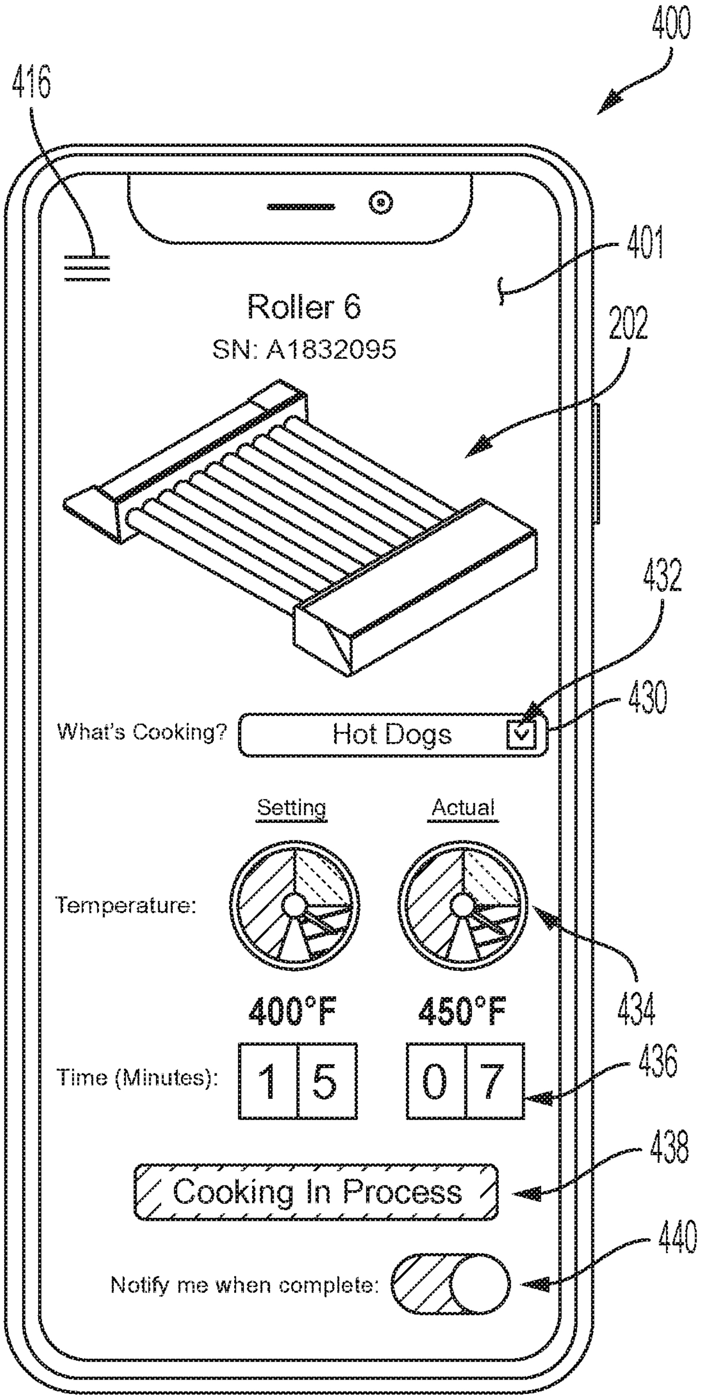
FIG. 14 is a front view of a third screen of the TEM device control application tool of FIG. 12.

As shown in FIG. 14, the GUI 401 may include a display 406 including a heatable item feature 430, a selection feature 432, a temperature feature 434, a timer feature 436, a status feature 438, and a notification feature 440. The heatable item feature 430 may be configured to display a type of heatable item 108 (e.g., hot dog) being heated or cooked by the coupled TEM device 102, 202, 302. The selection feature 432 may be configured to provide a drop-down menu to select from a plurality of options of heatable items 108 to display in the heatable item feature 430.

The temperature feature 434 may be configured to show a setting temperature (such as 400 degrees Fahrenheit) and an actual temperature (such as 450 degrees Fahrenheit) of the heating environment surrounding the TEM device 102, 202, 302, which may be a grill environment temperature of the grill 100 on which the TEM device 102, 202, 302 is disposed and/or a temperature of the TEM device 102, 202, 302 as measured through a heat sensor (e.g., as one of the one or more sensors 516). The timer feature 436 may be configured to set a timer, such as in minutes and seconds, to monitor a time the TEM device 102, 202, 302 is heating the heatable item 108. The status feature 438 may be configured to display a status of heating with respect to the heatable item 108 by the TEM device 102, 202, 302, such as "Cooking in Progress." The notification feature 440 may be configured to allow a user to select an option to be notified by the software application tool 402 when the cooking of the heatable item 108 and/or timer is complete.

The machine readable instructions may cause the system 500 to perform at least the following when executed by the one or more processors 504: monitor electricity generated by the at least one TEM 130, 230, 330 of the TEM device 102, 202, 302 based on a temperature differential, such as induced by a heat source such as the grill 100. The heat source may be any type of heating surface on which the TEM device 102, 202, 302 may be supported and configured to generate heat to induce a temperature differential in the at least one TEM 130, 230, 330 of the TEM device 102, 202, 302 as described herein. The machine readable instructions may further cause the system 500 to, when executed by the one or more processors 504, control rotation of the shaft 128, 228 in a first direction of rotation (e.g., the direction of the rotational arrows 112 of FIG. 2) upon receipt of electricity by the motor 124, 224, 362 from the at least one TEM 130, 230, 330 based on the temperature differential. Further, rotation of the first roller component 106, 206, 306, 306A coupled to the shaft 128, 228 in the first direction of rotation may be monitored upon rotation of the shaft 128, 228. Rotation of the second roller component 106, 206, 356 coupled to the first roller component 106, 206, 306, 306A in a second direction of rotation may be monitored upon rotation of the first roller component 106, 206, 306, 306A. As described herein, the second roller component 106, 206, 356 may be configured to support the heatable item 108 such that the heatable item 108 supported by the second roller component 106, 206, 356 is rotated in the first direction of rotation.

The machine readable instructions may further cause the system 500, when executed by the one or more processors 504, to use a settings feature 414 on the software application tool 402 to receive an input speed, such as by an entry by a user, and control a speed of rotation of the shaft 128, 228 in a first direction of rotation upon receipt of electricity by the motor 124, 224, 362 from the at least one TEM 130, 230, 330 based on the temperature differential via the software application tool 402 by setting the speed to the input speed of the settings feature 414.

Further, the machine readable instructions may cause the system 500, when executed by the one or more processors 504, to use a heat sensor (e.g., of the one or more sensors 516) communicatively coupled to the software application tool 402 to sense a temperature, and use a timer associated with a timer feature 436 on the software application tool 402 to track a heating time. A speed of rotation of the shaft 128, 228 in a first direction of rotation may be automatically controlled, such as via the speed component 512 of the system 500, upon receipt of electricity by the motor 124, 224, 362 from the at least one TEM 130, 230, 330 based on the temperature differential via setting the speed of rotation by the software application tool 402 based on the temperature sensed by the heat sensor and the heating time of the timer. Thus, the software application tool 402 as a TEM device control application tool may be configured to automatically control and optimize a motor speed of an associated communicatively coupled TEM device 102, 202, 302 based on a sensed heat and time component associated with the heating of a heatable item 108 being heated by the TEM device 102, 202, 302. Control of the motor speed is configured cause an associated control of a speed of the roller components, which in turn controls the speed at which a heatable item 108 is being turned by the roller components of the TEM devices 102, 202, 302 as described herein and heated. Such control aids in uniform heating, while also control a speed of heating, of the heatable item 108 by the TEM devices 102, 202, 302.

Items Listing

Item 1. A thermoelectric module (TEM) device may include at least one TEM configured to generate electricity based on a temperature differential, a motor including a shaft, a first roller component coupled to the shaft, and a second roller component coupled to the first roller component. The motor may be coupled to the at least one TEM and configured to rotate the shaft in a first direction of rotation upon receipt of electricity from the at least one TEM based on the temperature differential. The shaft may be configured to rotate the first roller component in the first direction of rotation, and the second roller component may be configured to support a heatable item. Rotation of the first roller component in the first direction is configured to rotate the second roller component in a second direction of rotation such that the heatable item supported by the second roller component is rotated in the first direction of rotation.

Item 2. The TEM device of Item 1, further including a side component including an enclosure configured to house the at least one TEM.

Item 3. The TEM device of Item 2, wherein the enclosure is further configured to house the motor, one or more heat sink components, and a motor housing, the motor housing comprises a heat shield and is configured to house the motor, and the heat shield is configured to shield the motor from heat.

Item 4. The TEM device of any of Item 1 to Item 3, wherein the first roller component and the second roller component are part of a plurality of roller components, and the side component comprises a plurality of gears configured to couple to the plurality of roller components.

Item 5. The TEM device of Item 4, wherein the plurality of gears comprising a motor gear and at least one adjacent gear coupled to the motor gear and the second roller component, and the motor gear is coupled to the first roller component and the shaft such that rotation of the shaft in the first direction is configured to rotate the motor gear in the first direction to rotate the at least one adjacent gear in the second direction.

Item 6. The TEM device of Item 5, wherein the plurality of gears each comprise a pinion, the pinion comprising a plurality of teeth, such that each tooth of the plurality of teeth of the motor gear is configured to engage an adjacent tooth of the plurality of teeth of the at least one adjacent gear during rotation.

Item 7. The TEM device of any of Item 2 to Item 6, wherein the side component is integral with the enclosure.

Item 8. The TEM device of any of Item 1 to Item 7, further comprising a side component including an enclosure configured to house the at least one TEM, wherein the side component is configured to receive the enclosure.

Item 9. The TEM device of Item 8, wherein the enclosure is configured to house the motor.

Item 10. The TEM device of Item 8, further including a motor assembly separate from the side component, wherein the motor assembly is configured to house the motor.

Item 11. The TEM device of Item 10, wherein the second roller component comprises a plurality of prongs, the plurality of prongs configured to support and hold the heatable item.

Item 12. The TEM device of any of Item 1 to Item 11, wherein the first direction is the same as the second direction.

Item 13. The TEM device of any of Item 1 to Item 11, wherein the first direction is different from the second direction.

Item 14. The TEM device of any of Item 1 to Item 13, wherein the first roller component and the second roller component are configured to be interchangeable with the TEM device, integral with the TEM device, or combinations thereof.

Item 15. The TEM device of any of Item 1 to Item 14, wherein the at least one TEM is configured to charge a battery coupled to the motor, and the motor is configured to rotate the shaft in the first direction of rotation via electricity from the battery when the temperature differential is not sufficient to activate the at least one TEM.

Item 16. A method of using a thermoelectric module (TEM) device to uniformly heat a heatable item may include disposing the TEM device on a heat source, the TEM device including at least one TEM, a motor including a shaft, a first roller component, and a second roller component, the at least one TEM configured to generate electricity based on a temperature differential induced by the heat source. The method may further include rotating the shaft in a first direction of rotation upon receipt of electricity by the motor from the at least one TEM based on the temperature differential, rotating the first roller component coupled to the shaft in the first direction of rotation upon rotation of the shaft, and rotating the second roller component coupled to the first roller component in a second direction of rotation upon rotation of the first roller component. The second roller component may be configured to support the heatable item such that the heatable item supported by the second roller component is rotated in the first direction of rotation.

Item 17. The method of Item 16, the TEM device further including a side component including an enclosure configured to house the at least one TEM. The side component is integral with or configured to receive the enclosure, the first direction is the same as or different from the second direction, and the first roller component and the second roller component are configured to be interchangeable with the TEM device, integral with the TEM device, or combinations thereof.

Item 18. A system may include a thermoelectric module (TEM) device including at least one TEM, a motor including a shaft, a first roller component, and a second roller component, a smart mobile device including a software application tool, the smart mobile device communicatively coupled to the TEM device via the software application tool, one or more processors communicatively coupled to the TEM device and the software application tool, a non-transitory memory communicatively coupled to the one or more processors, and machine readable instructions. The machine readable instructions may be stored in the non-transitory memory that cause the system to perform at least the following when executed by the one or more processors: monitor electricity generated by the at least one TEM of the TEM device based on a temperature differential, control rotation of the shaft in a first direction of rotation upon receipt of electricity by the motor from the at least one TEM based on the temperature differential, monitor rotation of the first roller component coupled to the shaft in the first direction of rotation upon rotation of the shaft, and monitor rotation of the second roller component coupled to the first roller component in a second direction of rotation upon rotation of the first roller component. The second roller component may be configured to support a heatable item such that the heatable item supported by the second roller component is rotated in the first direction of rotation.

Item 19. The system of Item 18, further including machine readable instructions that cause the system to perform at least the following when executed by the one or more processors: use a settings feature on the software application tool to receive an input speed, and control a speed of rotation of the shaft in a first direction of rotation upon receipt of electricity by the motor from the at least one TEM based on the temperature differential via the software application tool by setting the speed to the input speed of the settings feature.

Item 20. The system of Item 18 or Item 19, further including machine readable instructions that cause the system to perform at least the following when executed by the one or more processors: use a heat sensor communicatively coupled to the software application tool to sense a temperature, use a timer on the software application tool to track a heating time, and automatically control a speed of rotation of the shaft in a first direction of rotation upon receipt of electricity by the motor from the at least one TEM based on the temperature differential via setting the speed of rotation by the software application tool based on the temperature sensed by the heat sensor and the heating time of the timer.

It is noted that recitations herein of a component of the present disclosure being "configured" or "programmed" in a particular way, to embody a particular property, or to function in a particular manner, are structural recitations, as opposed to recitations of intended use. More specifically, the references herein to the manner in which a component is "configured" or "programmed" denotes an existing physical condition of the component and, as such, is to be taken as a definite recitation of the structural characteristics of the component.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermoelectric module (TEM)-driven device comprising:

a side component configured to at least partially support a plurality of roller components, the side component comprising a bottom support wall configured to contact a heat source and a plurality of gears configured to couple the plurality of roller components; and an enclosure that is removably dockable with the side component, the enclosure housing at least one TEM, one or more heat sinks supported on the at least one TEM, and a motor having a shaft, wherein:

docking the enclosure with the side component operatively engages the motor with a first of the plurality of roller components via the shaft and causes a face of the enclosure to abut at least a portion of the bottom support wall;

the at least one TEM is configured to generate electricity based on a temperature differential between the bottom support wall and the one or more heat sinks;

the motor is coupled to the at least one TEM and configured to rotate the shaft in a first direction of rotation upon receipt of electricity from the at least one TEM based on the temperature differential;

the first of the plurality of roller components and a first gear of the plurality of gears are coupleable to the shaft, and the shaft is configured to rotate the first roller component and the first gear in the first direction of rotation;

a second of the plurality of roller components is attached to a second gear of the plurality of gears and the second gear engages with the first gear, such that rotation of the first roller component and the first gear in the first direction of rotation causes the second roller component and the second gear to rotate in a second direction of rotation, the second direction of rotation being different than the first direction of rotation;

the first and second roller components are configured such that together they support a heatable item therebetween; and the one or more heat sinks supported on the at least one TEM are arranged to dissipate heat in an upward direction away from the bottom support wall.

2. The TEM device of claim 1, wherein the motor is further contained by a motor housing, the motor housing comprising a heat shield.

3. The TEM device of claim 1, wherein the plurality of gears each comprise a pinion having a plurality of teeth, such that the plurality of teeth of the first gear engage with the plurality of teeth of the second gear during rotation.

4. The TEM device of claim 1, wherein the first roller component and the second roller component are configured to be interchangeable with the TEM device, integral with the TEM device, or combinations thereof.

5. The TEM device of claim 1, wherein the at least one TEM is configured to charge a battery coupled to the motor, and the motor is configured to rotate the shaft in the first direction of rotation via electricity from the battery when the temperature differential is not sufficient to activate the at least one TEM.

6. A method of using a thermoelectric module (TEM)-driven device to uniformly heat a heatable item, the method comprising:

disposing on a heat source a side component configured to at least partially support a plurality of roller components, the side component comprising a bottom support wall configured to contact the heat source and a plurality of gears configured to couple the plurality of roller components;

removably docking an enclosure with the side component, thereby operatively engaging a motor contained within the enclosure with a first of the plurality of roller components and abutting a face of the enclosure against at least a portion of the bottom support wall, wherein:

the enclosure houses at least one TEM, one or more heat sinks supported on the at least one TEM, and the motor having a shaft;

the at least one TEM is configured to generate electricity based on a temperature differential between the bottom support wall and the one or more heat sinks;

the motor is coupled to the at least one TEM and configured to rotate the shaft in a first direction of rotation upon receipt of electricity from the at least one TEM based on the temperature differential;

the first of the plurality of roller components and a first gear of the plurality of gears are coupleable to the shaft, and the shaft is configured to rotate the first roller component and the first gear in the first direction of rotation;

a second of the plurality of roller components is attached to a second gear of the plurality of gears and the second gear engages with the first gear, such that rotation of the first roller component and the first gear in the first direction of rotation causes the second roller component and the second gear to rotate in a second direction of rotation, the second direction of rotation being different than the first direction of rotation;

the first and second roller components are configured such that together they support a heatable item therebetween; and the one or more heat sinks supported on the at least one TEM are arranged to dissipate heat in an upward direction away from the bottom support wall.

7. The method of claim 6, wherein the first roller component and the second roller component are configured to be interchangeable with the TEM device, integral with the TEM device, or combinations thereof.

8. A system comprising:

the TEM-driven device of claim 1;

a smart mobile device including a software application tool, the smart mobile device communicatively coupled to the TEM-driven device via the software application tool;

one or more processors communicatively coupled to the TEM-driven device and the software application tool;

a non-transitory memory communicatively coupled to the one or more processors; and machine readable instructions stored in the non-transitory memory that cause the system to perform at least the following when executed by the one or more processors:

monitor electricity generated by the at least one TEM of the TEM-driven device based on the temperature differential;

control rotation of the shaft in the first direction of rotation upon receipt of electricity by the motor from the at least one TEM based on the temperature differential;

monitor rotation of the first roller component coupled to the shaft in the first direction of rotation upon rotation of the shaft; and monitor rotation of the second roller component coupled to the first roller component in the second direction of rotation upon rotation of the first roller component.

9. The system of claim 8, further comprising machine readable instructions that cause the system to perform at least the following when executed by the one or more processors:

use a settings feature on the software application tool to receive an input speed; and control a speed of rotation of the shaft in the first direction of rotation upon receipt of electricity by the motor from the at least one TEM based on the temperature differential via the software application tool by setting the speed to the input speed of the settings feature.

10. The system of claim 8, further comprising machine readable instructions that cause the system to perform at least the following when executed by the one or more processors:

use a heat sensor communicatively coupled to the software application tool to sense a temperature;

use a timer on the software application tool to track a heating time; and automatically control a speed of rotation of the shaft in the first direction of rotation upon receipt of electricity by the motor from the at least one TEM based on the temperature differential via setting the speed of rotation by the software application tool based on the temperature sensed by the heat sensor and the heating time of the timer.

* * * * *